United States Patent [19]

Terstall

[11] Patent Number: 5,020,109

[45] Date of Patent: May 28, 1991

[54] APPARATUS FOR MODULATION OF THE TIMBRE OF AN ELECTRICAL AMPLIFIER, IN PARTICULAR FOR GUITARS

[75] Inventor: Robert Terstall, Neustadt, Fed. Rep. of Germany

[73] Assignee: Firma Roland Meinl, Neustadt, Fed. Rep. of Germany

[21] Appl. No.: 445,061

[22] Filed: Dec. 4, 1989

[30] Foreign Application Priority Data

Dec. 16, 1988 [DE] Fed. Rep. of Germany ....... 3842367

[51] Int. Cl.[5] ........................................ H03G 3/00

[52] U.S. Cl. ........................................ 381/61; 381/118; 84/736; 84/DIG. 9

[58] Field of Search ................... 336/136; 84/DIG. 9, 84/736; 381/118, 199, 201, 61

[56] References Cited

U.S. PATENT DOCUMENTS

| | | | |
|---|---|---|---|
| 3,504,320 | 3/1970 | Engdahl et al. | 336/136 |
| 4,000,381 | 12/1976 | Plice et al. | 381/199 |
| 4,134,065 | 1/1979 | Bauer et al. | 336/136 |

*Primary Examiner*—Jin F. Ng

*Assistant Examiner*—Sylvia Chen

*Attorney, Agent, or Firm*—Browdy and Neimark

[57] ABSTRACT

In an apparatus for modulation of the timbre of an electrical amplifier, in particular for guitars, a cylindric coil (2), which can be disposed downstream of an amplifier output, and a bar magnet (3) inside the cylindric coil (2), which can be deflected against restoring forces within a limited amplitude range out of its position of equilibrium, are provided for achieving a tonal effect corresponding to the direct connection of a loudspeaker.

17 Claims, 1 Drawing Sheet

APPARATUS FOR MODULATION OF THE TIMBRE OF AN ELECTRICAL AMPLIFIER, IN PARTICULAR FOR GUITARS

FIELD OF THE INVENTION

The invention relates to an apparatus for modulation of the timbre of an electrical amplifier, and more particularly to a tube amplifier for guitars.

BACKGROUND OF THE INVENTION

Amplifiers of the type under consideration are used for the amplification of electrical oscillations generated by means of a musical instrument. In order to obtain the sound waves required for a concert, it is possible to use a plurality of loudspeakers disposed downstream of an amplifier. Another possibility is to use an amplifying and loudspeaker system, either already in place or to be installed in a concert hall, for increasing output and reproduction. In this case a preamplifier, disposed downstream of the instrument, is generally used to adjust the musical sound or to obtain certain sound effects. If operated in the way last mentioned, a problem occurs in that the particular timbre resulting from the combination of, in particular, tube amplifiers with loudspeakers disposed immediately downstream of them, cannot be achieved. This combination is something which is considered to be especially desirable by concert artists.

SUMMARY OF THE INVENTION

It is an object of the invention to produce an apparatus of the type recited above which, in spite of the use of an amplifying and loudspeaker system in a concert hall, makes it possible to imitate the timbre achieved by the direct combination of an amplifier, in particular a tube amplifier, and of a loudspeaker placed immediately downstream of it, i.e. the timbre of an amplifier operated under load.

This object is attained in accordance with the present invention by means of a cylindric coil, which can be placed downstream of the amplifier output, and of a bar magnet inside the cylindric coil, which can be deflected against restoring forces within a limited amplitude range from a position of equilibrium. In connection with this it is provided that the mass of the rod magnet approximately corresponds to that of the coil and diaphragm of a loudspeaker which is to be simulated.

The invention proceeds from the idea that the specific timbre which is based on the direct connection of an amplifier with a loudspeaker is, in general, the result of the interaction of the amplifier and loudspeaker. Because of the excitation of the coil connected with the diaphragm of the loudspeaker by the electrical oscillations at the output of the amplifier, a mechanical oscillation of the diaphragm is generated, which, in turn, generates and returns electrical oscillations, phase-shifted in respect to the output of the amplifier. This effect is imitated by the apparatus according to the present invention, in which, because of the magnetic field generated in the cylindric coil, the bar magnet is excited into oscillations around its position of equilibrium and, in turn, induces a phase-shifted current in the cylindric coil. By correspondingly coordinating the mass of the oscillating magnet in relation to the size of the coil, which for example may have — corresponding to the customary size of loudspeakers — an impedance of 8 Ohms, the apparatus in accordance with the invention generates similar feedback conditions as in the direct control of a loudspeaker, so that the tone of the loudspeaker system operated via the amplifier in the concert hall is correspondingly modified.

In a further improvement of the invention it is provided that the exterior cross section of the bar magnet approximately corresponds to the interior cross section of the cylindric coil, i.e. the respective cross sections have the same geometrical configuration and only a narrow gap exists between the magnet and the coil, which allows for movement with little friction. In the simplest case, the inside of the coil and the outside of the magnet each have a round cross-section.

In principle, to achieve a position of equilibrium for the bar magnet it might be desirable to support it in a mechanical elastic manner by means of springs or a membrane. However, in accordance with the invention it is preferable to dispose, at both ends of the cylindric coil, magnets of a polarity opposite to that of the respective ends of the bar magnet so as to achieve its position of equilibrium. This means that the repulsive forces on the bar magnet of the magnets disposed at these ends increase as they come increasingly closer, so that the bar magnet is maintained or, in case of deflection, pushed back into a position of mean equilibrium.

There may also be provided a housing in which to dispose the cylindric coil and the bar magnet, the housing containing a damping or cooling fluid. This fluid may be oil, water, alcohol or the like. This fluid may act as a damping medium in regard to the oscillation movements of the magnet and also as a cooling fluid to disperse the heat generated by the mechanical oscillations of the magnet.

For this reason, it is possible to dispose, in particular, an annular gap between the exterior of the cylindric coil and the interior wall of the housing. Such an annular gap allows for the circulation along the outside wall of the fluid brought into motion by the oscillating bar magnet and in this manner a satisfactory heat transfer to the exterior wall of the housing.

In order to attain as satisfactory as possible radiation of the heat generated, it is possible to provide, in a manner known per se, cooling ribs on the exterior housing wall.

To provide a direct measuring and control opportunity for the tonal effects generated by the apparatus according to the invention, a measuring coil, which at least partially surrounds the cylindric coil and has electrical connection to the outside, can be provided. A voltage corresponding to that in the cylindric coil is generated in this coil. The outer coil should be made more highly resistant, for example with an impedance of 600 Ohms.

Alternatively, the measuring coil may be disposed in the axial extension of the cylindric coil and the bar magnet may be axially connected with a further magnet, axially moveably disposed in the measuring coil. With this arrangement an elongated design is achieved, which also makes it possible to adjust the size of the secondary voltage to the desired level in a particularly simple manner.

A preferred exemplary embodiment of the invention is described below by means of the drawings.

BRIEF DESCRIPTION OF THE DRAWING

The figure is a schematic sectional view of a device in accordance with the present invention.

DETAILED DESCRIPTION OF THE PREFERRED EMBODIMENTS

Figure 1:
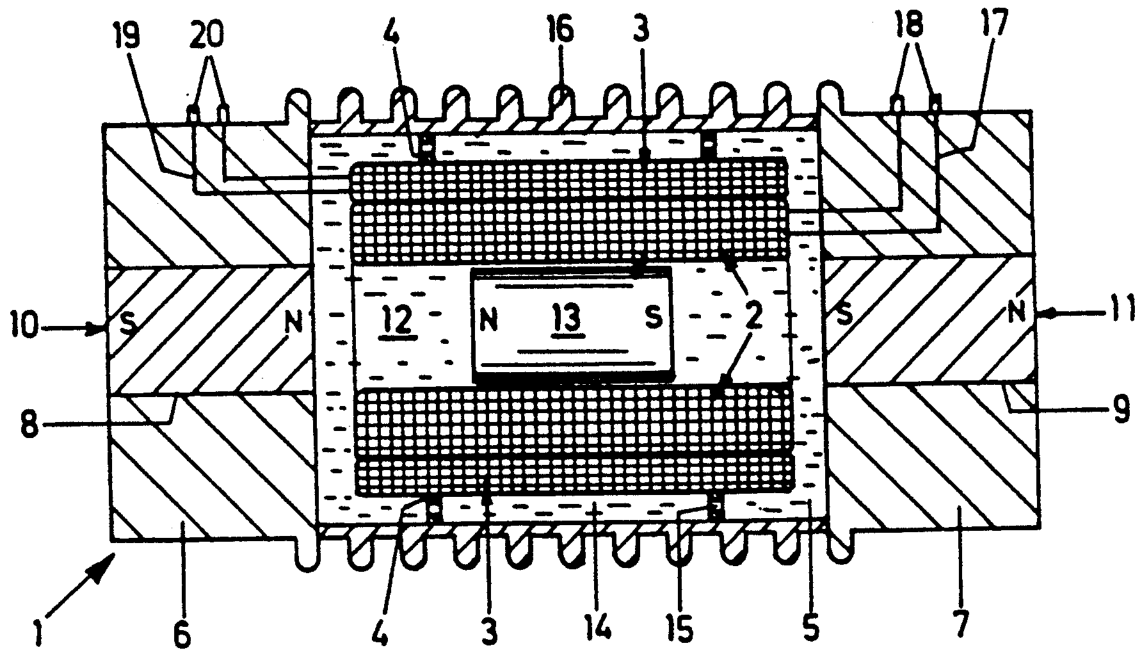

A housing 1 is shown in the drawing, inside which a first cylindric coil 2 surrounded by a second cylindric coil 3 is supported by means of annular holders 4.

The interior chamber 5 which contains the coils 2, 3, is bounded by frontal walls 6, 7, in the central area of which bar magnets 10, 11 are disposed in a bore 8 and 9. The ends of the bar magnets 10, 11 oriented towards the interior chamber have opposite polarities. In the exemplary embodiment, the inner end of the bar magnet 10 is its magnetic north pole (N) and the inner end of the bar magnet 11 is its magnetic south pole (S).

The free interior chamber 12 of the cylindric coil 2 is circular in cross section. A permanent bar magnet 13 is disposed in this inner chamber, the exterior cross section of which approximately corresponds to the interior cross section of the cylindric coil 2, so that the magnet 13 is disposed easily gliding in the interior chamber 12. The magnet 13 has the same polarity facing the fixed magnet 10, i.e. in the drawings the north pole of the magnet 13 is at the left. Correspondingly, the south pole of the magnet 13 is to the right in the drawings and faces the south pole of the fixed magnet 11. Because of this, the magnet 13 is not only disposed along the longitudinal axis of the coil 2 so that it is able to oscillate, it is also maintained in a position of mean equilibrium by the magnets 10, 11.

The interior chamber 5 of the housing 1 may be filled with a damping and cooling fluid which, when the magnet moves, is allowed to circulate through the annular gap 14 between the outer cylindric coil 3 and the housing 1 and through cut-outs 15 in the support rings 4. In this way the fluid can transfer heat to the housing 1. This heat is then outwardly radiated via cooling ribs 16, as are known per se.

The interior coil 2 is connected via schematically indicated electrical connecting lines 17 with the plug outputs 18. The exterior cylindric coil 3 is connected via electric lines 19 with plug inputs 20.

The electrical apparatus described above is placed downstream of an amplifier via the inputs 18. The amplifier will usually be in the form of a tube amplifier. Parallel with this, the preamplifier is connected to a stationary amplifier and loudspeaker system of a concert hall. Based on the magnetic field generated by the output signal of the pre-amplifier in the cylindric coil 2, the bar magnet 13 is excited and, in turn, generates current in the coil 2, so that an alternating effect between the amplifier and the apparatus shown in the drawings is created, corresponding to that which would be generated with a loudspeaker connected downstream.

To control the tone effect directly, head phones or monitor loudspeakers may be connected at the outputs 20.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

What is claimed is:

1. An apparatus for modulation of the timbre of an electrical amplifier and a loudspeaker placed downstream thereof, in particular for guitars, the loudspeaker having a coil and a diaphragm, the combination of comprising; a cylindrical coil (2), which is connectable downstream of an amplifier output, a bar magnet (13) inside the cylindrical coil (2), which is deflected against restoring forces within a limited amplitude range out of its position of equilibrium, wherein the mass of the bar magnet (13) approximately corresponds to that of the coil and diaphragm of the loudspeaker.

2. An apparatus in accordance with claim 1, wherein the exterior cross section of the bar magnet (13) approximately corresponds to the interior cross section of the cylindrical coil (2).

3. An apparatus in accordance with claim 1, wherein the cylindrical coil (2) and the bar magnet (13) are disposed in a housing (1) containing a damping or cooling fluid.

4. An apparatus in accordance with claim 3, further comprising an annular gap (14) between the outside of the cylindrical coil (2) and the interior wall of the housing.

5. An apparatus in accordance with claim 1, further comprising a measuring coil (3), said measuring coil at least partially surrounding said cylindrical coil (2).

6. An apparatus for modulation of the timbre of an electrical amplifier, in particular for guitars, comprising; a cylindrical coil (2), which is connectable downstream of an amplifier output, a bar magnet (13) inside the cylindrical coil (2), which is deflected against restoring forces within a limited amplitude range out of its position of equilibrium,. magnets (10, 11) of a polarity opposite to that of the respective ends of the bar magnet (13), said magnets disposed at both ends of the cylindrical coil (2) for achieving the position of equilibrium of the bar magnet (13).

7. An apparatus in accordance with claim 6, wherein the exterior cross section of the bar magnet (13) approximately corresponds to the interior cross section of the cylindrical coil (2).

8. An apparatus in accordance with claim 6, wherein the cylindrical coil (2) and the bar magnet (13) are disposed in a housing (1) containing a damping or cooling fluid.

9. An apparatus in accordance with claim 8, further comprising an annular gap (14) between the outside of the cylindrical coil (2) and the interior wall of the housing.

10. An apparatus in accordance with claim 6, further comprising a measuring coil (3), said measuring coil at least partially surrounding said cylindrical coil (2).

11. An apparatus for modulation of the timbre of an electrical amplifier, in particular for guitars, comprising a cylindrical coil (2), which is connectable downstream of an amplifier output, a bar magnet (3) inside the cylindrical coil (2), which is deflected against restoring forces within a limited amplitude range out of its position of equilibrium, the cylindric coil (2) and the bar magnet (13) disposed in a housing (1) containing a damping or cooling fluid, an annular gap (14) between the outside of the cylindrical coil (2) and the interior wall of the housing, and cooling ribs (16) disposed on the exterior wall of said housing.

12. An apparatus in accordance with the claim 11, wherein the exterior cross section of the bar magnet (13) approximately corresponds to the interior cross section of the cylindrical coil (2).

13. An apparatus in accordance with claim 12, further comprising a measuring coil (3), said measuring coil at least partially surrounding said cylindrical coil (2).

14. An apparatus for modulation of the timbre of an electrical amplifier, in particular for guitars, comprising a cylindrical coil (2), which is connected downstream of an amplifier output, a bar magnet (13) inside the cylindrical coil (2), which is deflected against restoring forces within a limited amplitude range out of its position of equilibrium, a measuring coil, wherein the measuring coil is disposed in the axial extension of the cylindrical coil (2), and the bar magnet (13) is axially connected with a further magnet, wherein said further magnet is axially moveably disposed in the measuring coil.

15. An apparatus in accordance with claim 14, wherein the exterior cross section of the bar magnet (13) approximately corresponds to the interior cross section of the cylindrical coil (2).

16. An apparatus in accordance with claim 14, wherein the cylindrical coil (2) and the bar magnet (13) are disposed in a housing (1) containing a damping or cooling fluid.

17. An apparatus in accordance with claim 16, further comprising an annular gap (14) between the outside of the cylindrical coil (2) and the interior wall of the housing.

* * * * *